United States Patent
Ye et al.

(10) Patent No.: US 7,034,544 B2
(45) Date of Patent: Apr. 25, 2006

(54) METHODS FOR MINIMIZING THE IMPEDANCE DISCONTINUITY BETWEEN A CONDUCTIVE TRACE AND A COMPONENT AND STRUCTURES FORMED THEREBY

(75) Inventors: Xiaoning Ye, Hillsboro, OR (US); Dennis Miller, Sherwood, OR (US); Jerry D. Bolen, Molalla, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/611,791

(22) Filed: Jun. 30, 2003

(65) Prior Publication Data

US 2004/0263181 A1    Dec. 30, 2004

(51) Int. Cl.
 *G01R 31/11* (2006.01)
 *H05K 7/02* (2006.01)
 *H03H 7/38* (2006.01)

(52) U.S. Cl. .................. 324/534; 361/777; 333/33

(58) Field of Classification Search ................ 324/519, 324/531, 532, 533, 534, 535; 361/760, 761, 361/777; 333/33
See application file for complete search history.

(56) References Cited

U.S. PATENT DOCUMENTS

| | | | | |
|---|---|---|---|---|
| 4,517,535 | A * | 5/1985 | Pon | 333/81 A |
| 4,551,747 | A * | 11/1985 | Gilbert et al. | 257/691 |
| 5,608,591 | A * | 3/1997 | Klaassen | 360/245.9 |
| 6,053,751 | A * | 4/2000 | Humphrey | 439/108 |
| 6,111,205 | A | 8/2000 | Leddige et al. | |
| 6,348,233 | B1 * | 2/2002 | Brody et al. | 427/117 |
| 6,366,466 | B1 * | 4/2002 | Leddige et al. | 361/760 |
| 6,501,278 | B1 * | 12/2002 | Arabi | 324/533 |
| 6,512,181 | B1 * | 1/2003 | Okubo et al. | 174/255 |
| 6,531,932 | B1 * | 3/2003 | Govind et al. | 333/34 |
| 6,617,524 | B1 * | 9/2003 | Vo | 174/260 |
| 6,716,072 | B1 * | 4/2004 | Downes | 439/876 |
| 6,856,210 | B1 * | 2/2005 | Zhu et al. | 333/33 |
| 2001/0051210 | A1 | 12/2001 | Brody et al. | |
| 2001/0054939 | A1 | 12/2001 | Zhu et al. | |
| 2002/0040809 | A1 | 4/2002 | Okubo et al. | |

FOREIGN PATENT DOCUMENTS

| | | |
|---|---|---|
| EP | 0 557 136 A2 | 2/1993 |
| EP | 0 817 548 A1 | 1/1998 |

OTHER PUBLICATIONS

"Internal Signal Land Flares", IBM Technical Disclosure Bulletin, IBM Corp., Dec. 1, 1993, pp. 255-256, vol. 36, No. 12, XP000418960, ISSN: 0018-8689, New York, NY, USA.

* cited by examiner

*Primary Examiner*—Anjan Deb
*Assistant Examiner*—Jeff Natalini
(74) *Attorney, Agent, or Firm*—Kathy J. Ortiz

(57) ABSTRACT

Methods and apparatus that minimize the impedance discontinuity between a component and a signal trace is described. The methods and apparatus generally comprise at least one signal trace disposed on a dielectric layer, wherein the signal trace comprises a first width which is wider than a second width, a via connected to the first width of the signal trace, and a component electrically attached to the via, wherein an impedance discontinuity between the signal trace and the component is lowered.

20 Claims, 9 Drawing Sheets

METHODS FOR MINIMIZING THE IMPEDANCE DISCONTINUITY BETWEEN A CONDUCTIVE TRACE AND A COMPONENT AND STRUCTURES FORMED THEREBY

FIELD OF THE INVENTION

The present invention relates generally to circuit boards, test structures and test systems, as well as methods to form such circuit boards, test structures and test systems, and more specifically to structures and methods for minimizing the impedance discontinuity between a conductive trace and a component.

BACKGROUND OF THE INVENTION

As chip size continues to be reduced and signals are clocked at ever increasing frequencies, high-speed, high-frequency signals being driven between chips via traces on a printed circuit boards ("PCB's") may be subject to detrimental impedance effects. One manifestation of these impedance effects is unwanted reflections due to impedance mismatches (i.e., impedance discontinuities between a signal trace and a component, for example, that may impair the performance and reliability of a circuit). The high-speed, high-frequency signals may also be prone to cross-talk and electromagnetic interference ("EMI").

One way of verifying the impedance characteristics of a particular component on a PCB is to observe signal reflections from the component when high-speed test signals are launched onto the associated circuit board. Sample test areas are therefore incorporated into circuit board designs to facilitate connection to impedance measurement tools. Such test structures are used to verify behavior of the PCB itself, as well as various attached circuit packages, sockets, and connectors.

The industry-standard tool used for circuit board impedance measurements is the Time Domain Reflectometer (TDR). In setting up for actual circuit board impedance measurements, the TDR probing approach is of great concern. Impedance matching between the TDR connection and the board is critical. Any impedance discontinuity in this area will inevitably appear as an inaccurate TDR reading.

SMA (subminiature series A) connectors are sometimes used to couple TDR equipment to the circuit board for testing. SMA connectors are advantageous because they are inexpensive, possess high mechanical strength, and are easy to probe. However, this type of connector installation is usually less than satisfactory, since it may contribute to an impedance discontinuity between the probe and the circuit board at high frequencies.

To help reduce such discontinuities, the width of a trace within a PCB may be changed. Since the size of the signal trace affects its characteristic impedance, the impedance of the trace can be decreased by increasing the trace surface width. However, a wide trace may use too much PCB area (real estate) in certain implementations. Thus, there is a need to reduce impedance discontinuities in PCBs while also avoiding the use of overly wide traces.

The present invention provides circuit structures and methods that can be applied to test high-speed signals on circuit boards and components for high-speed signal performance characterization purposes. Such circuit structures and methods will minimize impedance discontinuities between high-speed components and the circuit board.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
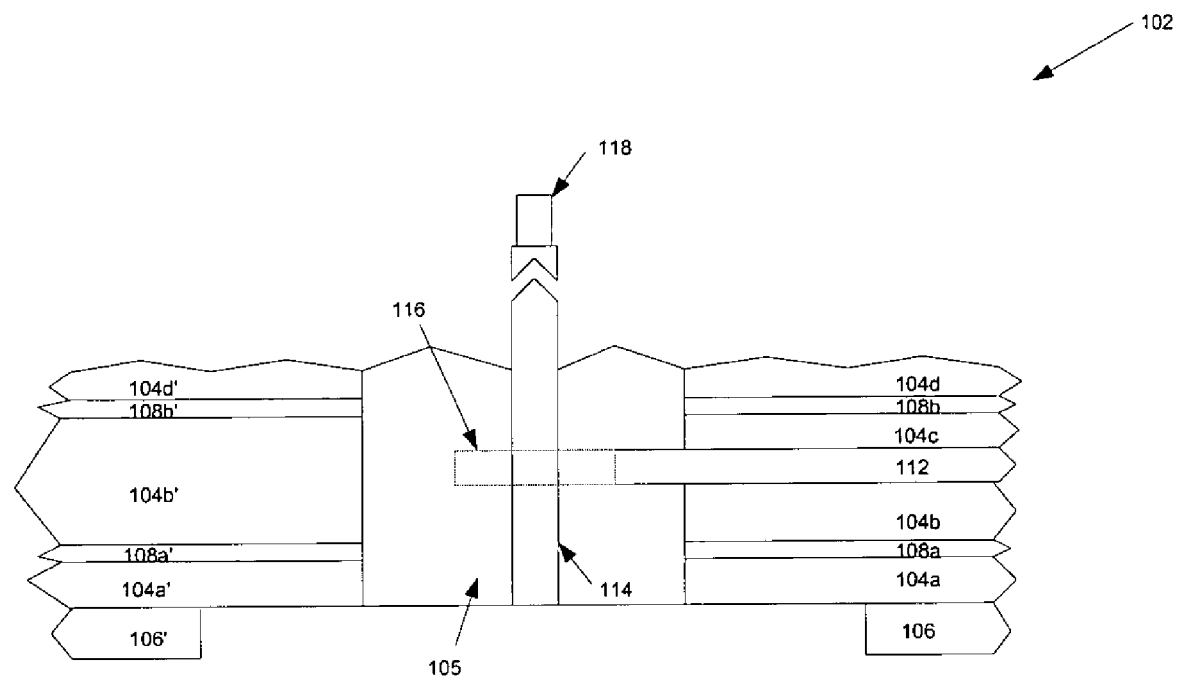
FIG. 1a represents a cross-section of a structure that may be formed when carrying out an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. It is further to be understood that such terms as top and bottom are relative terms that may be interchangeable depending upon the particular orientation of the structures described herein. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

In one embodiment of the present invention, an apparatus that minimizes the impedance discontinuity between a component and a signal trace on a circuit board is described. The apparatus generally includes at least one signal trace disposed on a dielectric layer, wherein the signal trace comprises a first width which is wider than a second width, a via connected to the first width of the signal trace, and a component electrically attached to the via, wherein an impedance discontinuity between the signal trace and the component is lowered.

FIG. 1a is a cross-sectional representation of a multi-layer circuit board 102 (which may comprise a strip-line configuration, which is well known in the art), as are well known in the art, in accordance with an embodiment of the invention. The multi-layer circuit board 102 may include a partial stack-up such as G/P-S-G/P-S (ground/power-signal-ground/power-signal) as illustrated in FIG. 1a. The multi-layer circuit board 102 may include at least one dielectric layer (illustrated in FIG. 1a as first dielectric layer 104a, a second dielectric layer 104b, a third dielectric layer 104c, and a fourth dielectric layer 104d). By way of illustration and not limitation, the dielectric layer 104a, 104b, 104c, 104d can be made from a fluororesin, a polynorbornene resin, a benzocyclobutene resin, a polyimide resin, an epoxy resin, or other suitable materials as are well known in the art.

The multi-layer circuit board 102 may include at least one ground pad 106 (which may be a bottom signal layer, as is known in the art) which may be disposed on at least one dielectric layer, and is illustrated as being disposed on the first dielectric layer 104a in FIG. 1a. The ground pad 106 may be electrically connected to at least one ground plane layer (illustrated in FIG. 1a as first ground plane layer 108a, 108a', and a second ground plane layer 108b, 108b') by various manners well known in the art, such as through the use of a shorting via, (not shown).

The multi-layer circuit board 102 may further include at least one signal trace 112 disposed on at least one dielectric layer (illustrated in FIG. 1a as disposed on the second dielectric layer 104b) that may be a high-speed, high-frequency signal trace 112 as is known in the art. The signal trace 112 may further comprise a via pad 116. The via pad 116 may be electrically connected to a via 114, which may be a plated through hole via, for example, as is known in the art. A component 118 (which may comprise a signal pin of a component) may also be electrically connected to the via 114. By illustration and not limitation, the component 118 may include a connector, for example a radio frequency connector that may operate in the gigahertz range such as a Sub Miniature Series A (SMA) connector, a Bayonet Nut Connector (BNC), or a single in-line (SIP) connector. The component 118 may also include a socket, a microprocessor, or a circuit, such as a memory circuit, all of which are well known to those skilled in the art. The component 118 is further electrically connected to the signal trace 112 through the via 114 and via pad 116. Adjacent to the first ground plane layer 108a, 108a and the second ground plane layer 108b, 108b' and disposed over and/or under (see FIG. 1a) the via pad 116 is an anti-pad region 105 which functions as an isolation region around the via 114 and the ground plane. The signal trace 112 does not have an underlying ground plane layer such as the first ground plane layer 108a, 108a', and the second ground plane layer 108b, 108b' in the region of the anti-pad region 105.

Figure 1B:
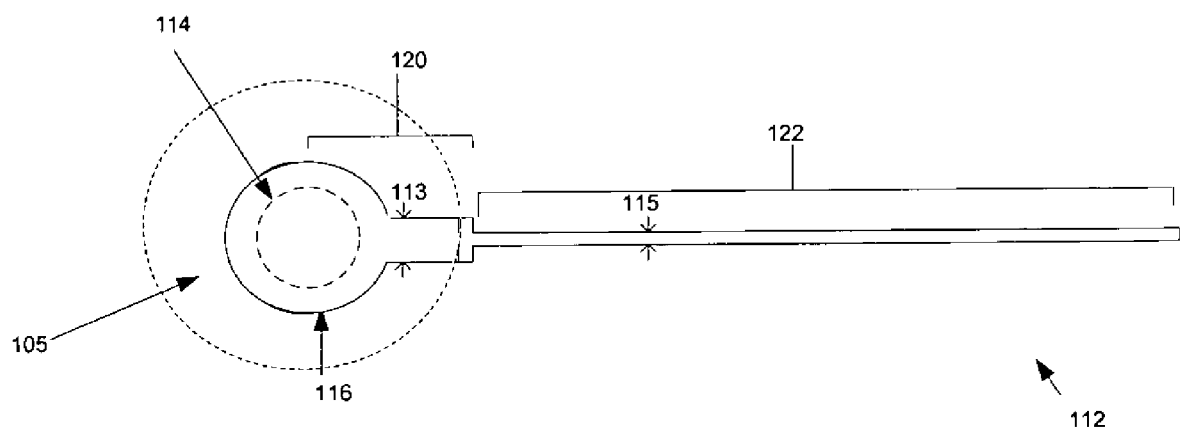
FIG. 1b represents a top plan view of a structure that may be formed when carrying out an embodiment of the present invention.

FIG. 1b depicts a top plan view of the signal trace 112, via pad 116, via 114 and anti-pad region 105 (shown isolated from the multi-layer circuit board 102 for ease of illustration). As depicted in FIG. 1b, the signal trace 112 further comprises a first width 113 and a second width 115. The first width 113 and the second width 115 are generally continuous regions of the signal trace 112. The first width 113 is located in a signal trace anti-pad region 120, and is substantially disposed on the anti-pad region 105. The second width 115 is located in a ground plane region 122, and is substantially disposed over an underlying ground plane layer (shown in FIG. 1a as disposed over the first ground plane layer 108a). Referring back to FIG. 1b, the signal trace anti-pad region 120 preferably extends from approximately the center of the via 114, to slightly past the edge of the anti-pad region 105. The length of the signal trace anti-pad region 120 may vary depending upon particular circuit board design requirements. The ground plane region 122 extends from slightly past the edge of the anti-pad region 105 to the end of the signal trace 112 opposite the first width 113 of the signal trace 112.

Figure 1C:
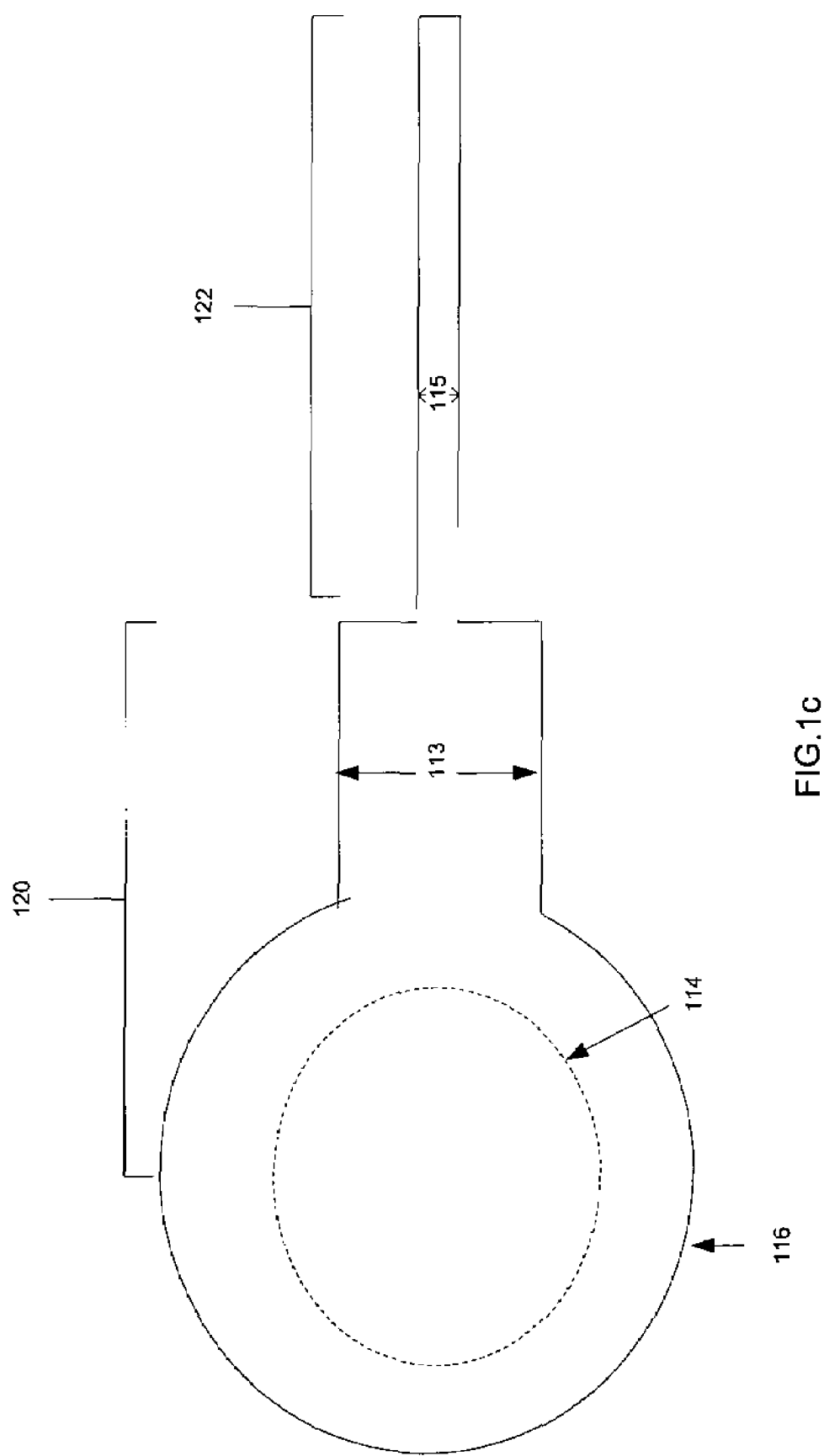
FIG. 1c represents a top plan view of a structure that may be formed when carrying out an embodiment of the present invention.

The first width 113 and the second width 115 of signal trace 112 are shown in greater detail in FIG. 1c. In order to compensate for the lack of a ground plane layer, such as the first ground plane layer 108a (FIG. 1a), underlying the signal trace 112 in the signal trace anti-pad region 120, the first width 113 of the signal trace 112 is made to be wider than the second width 115 of the signal trace 112. Making the first width 113 wider in the signal trace anti-pad region 120 enables the signal trace 112 to be more capacitive in the signal trace anti-pad region 120 and therefore have less impedance than signal traces of the prior art. The ratio of the first width 113 of the signal trace 112 to the second width 115 of the signal trace 112 may range from about 2:1 to about 3:1, but depends on the particular application.

Figure 2A:
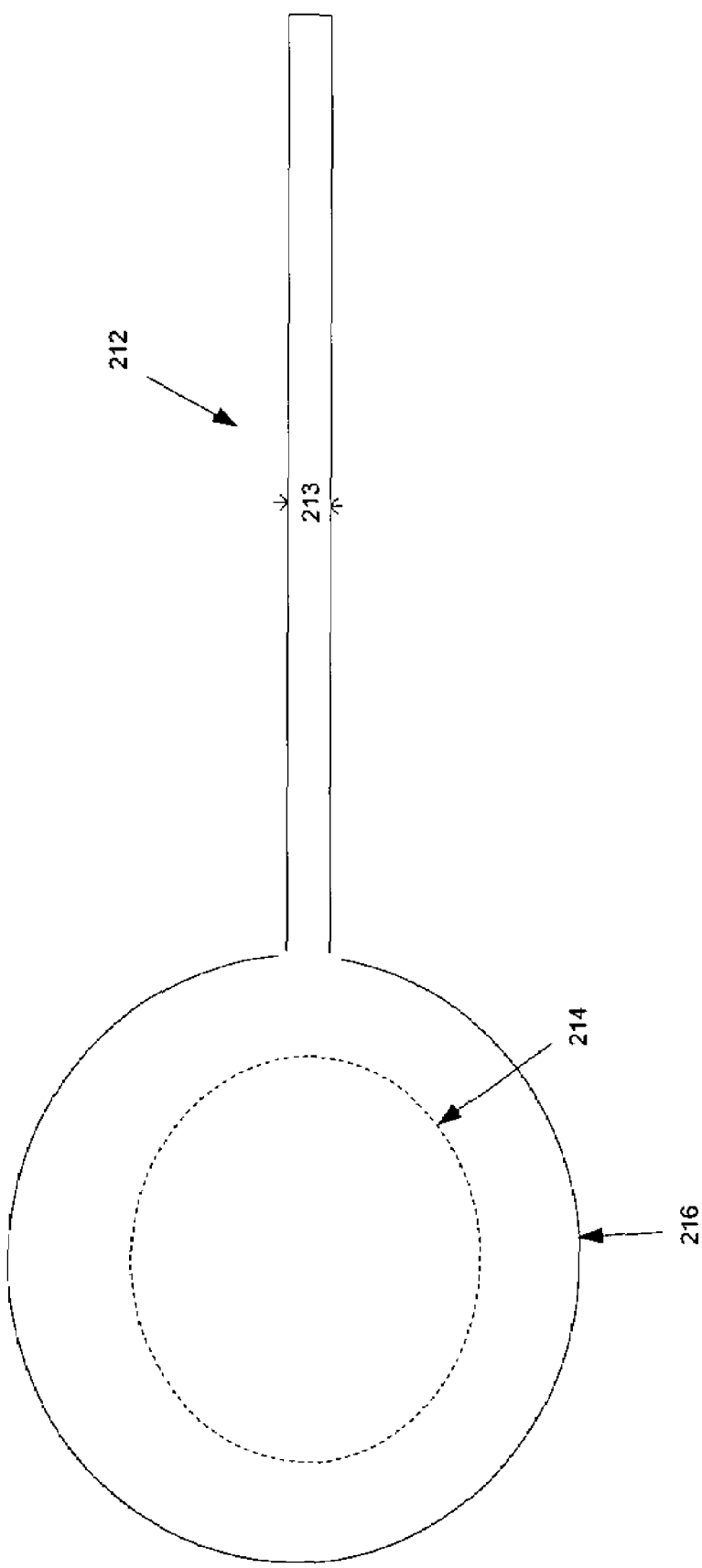
FIG. 2a represents a top plan view of a Prior Art signal trace and via structure.

As shown in FIG. 2a (Prior Art), a prior art signal trace 212 may comprise a via pad 216 and may be electrically connected to a via 214. The prior art signal trace 212 may comprise substantially the same width 213 throughout the length of the prior art signal trace 212. The prior art signal trace 212 exhibits a higher impedance discontinuity between the prior art signal trace 212 and an electrically connected component, (such as the component 118, not shown), than as between the signal trace 112 and the electrically connected component 118 of the present invention (FIG. 1a).

Figure 2B:
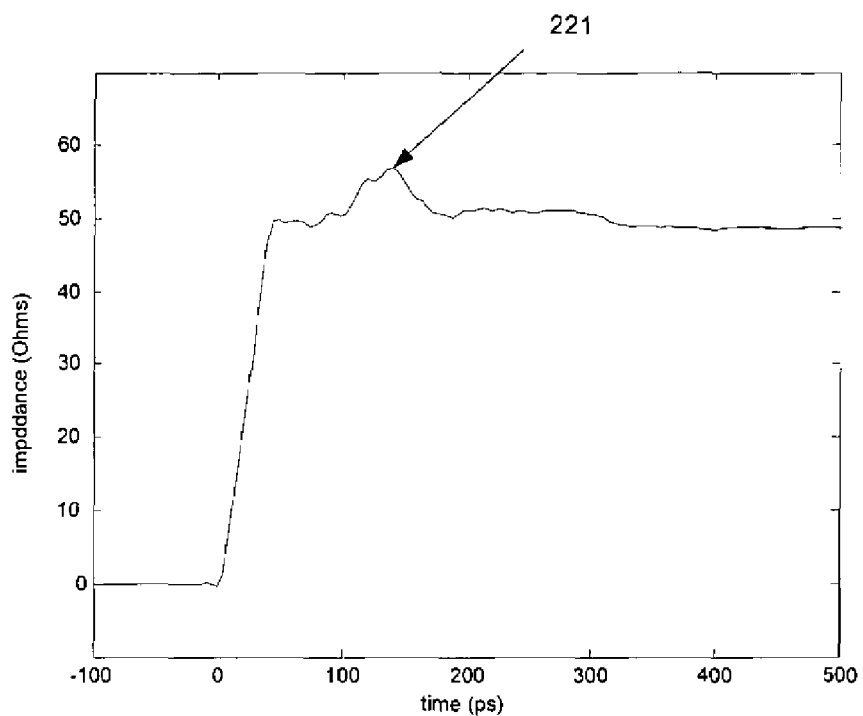
FIG. 2b represents a Prior Art impedance discontinuity between a component and a signal trace as performed by a TDR simulation.
Figure 3:
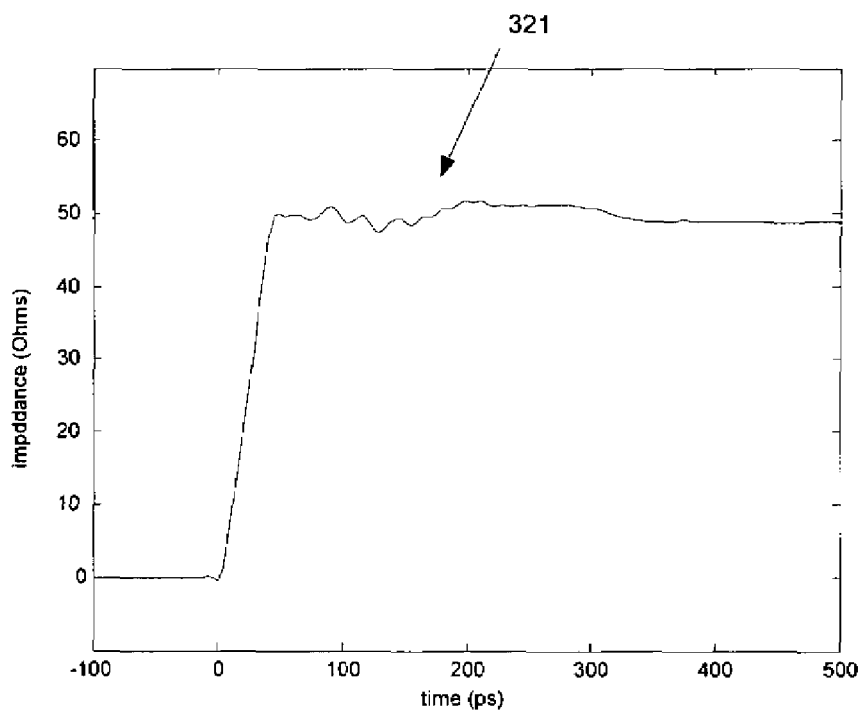
FIG. 3 represents an impedance discontinuity between a component and a signal trace as performed by a TDR simulation in accordance with the present invention.

FIG. 2b depicts a prior art impedance discontinuity 221 (as measured by a TDR simulation) that exists between a component, such as the component 118 of the present invention, and a prior art signal trace, such as the prior art signal trace 212 of FIG. 2a. Such a discontinuity is typically about 5 ohms or greater as measured between the component and the prior art signal trace 212. FIG. 3 depicts an impedance discontinuity 321 between a component, such as component 118 of the present invention, and the signal trace 112 of the present invention. The wider width of the signal trace 112 in the signal trace anti-pad region 120 minimizes the impedance discontinuity 321, since widening the signal trace 112 makes it less inductive. Thus, the multi-layer circuit board 102 of the current embodiment of the present invention renders the component 118 more suitable for microwave frequency (5 GHz and above) operations and/or test measurements of the component 118, by achieving an impedance discontinuity 321 that is less than 1 ohm (FIG. 3).

Referring back to FIG. 1b, the dimensions of the anti-pad region 105, via pad 116 and via 114 can be optimized to further reduce the impedance between the component 118 and the signal trace 112, since their respective geometries affect the impedance of the connection between the component 118 and the signal trace 112. Thus, the circuit board 102 may be used to test high frequency devices, such as devices operating at microwave frequency (5 GHz and above).

Figure 4A:
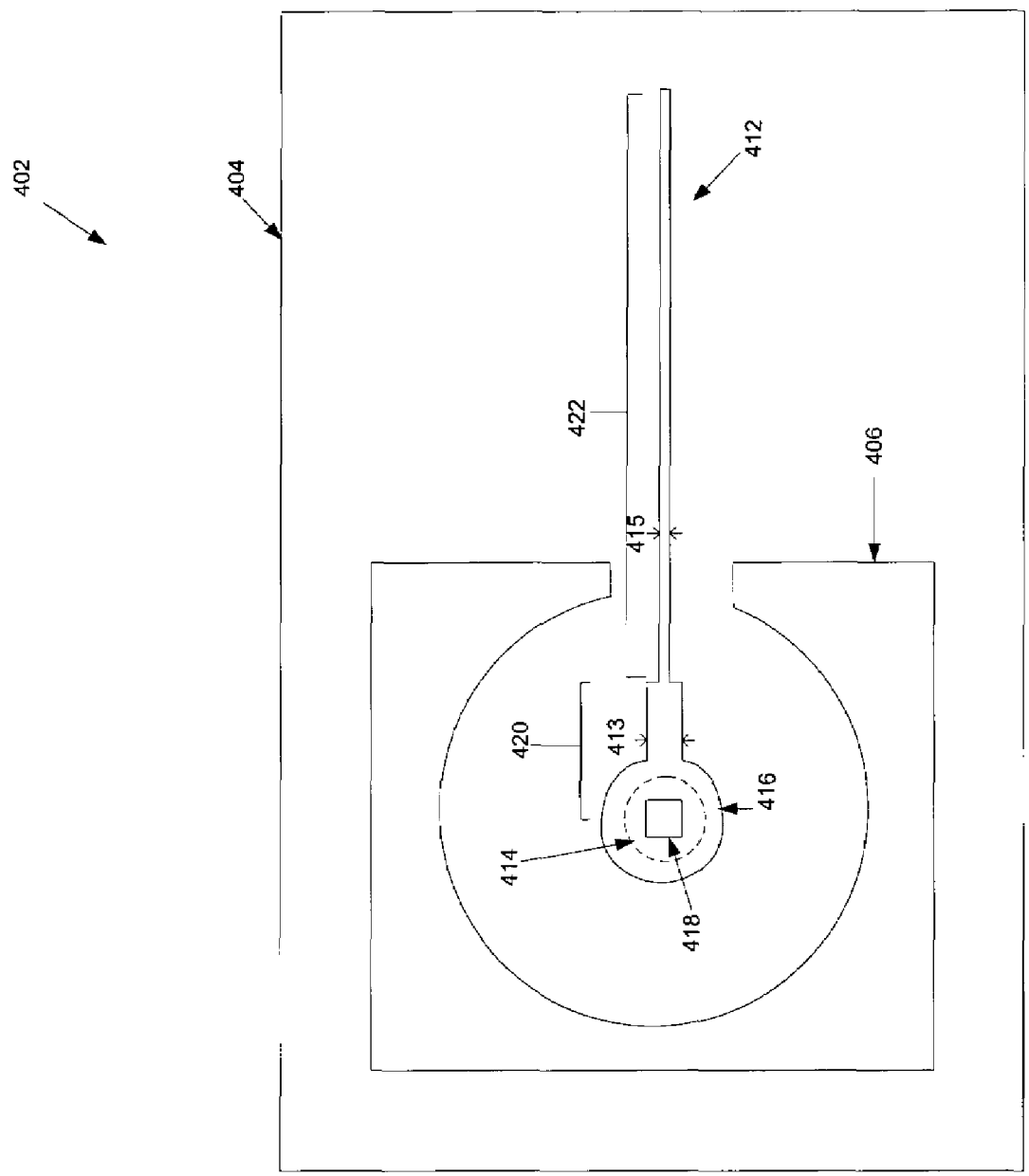
FIG. 4a represents a top plan view of a test structure that may be formed when carrying out an embodiment of the present invention.

FIG. 4a represents a top plan view of a test structure 402 in accordance with another embodiment of the present invention. The test structure 402 may include a signal trace 412 (similar to the signal trace 112) disposed on a dielectric layer 404, a ground pad 406 disposed on the dielectric layer 404, and a via 414 that may be electrically connected to the signal trace 412. The signal trace 412 may further comprise a via pad 416. A component 418 may be electrically connected to the via 414. The component 418 may include a radio frequency connector, such as a SMA connector, or various other types of connectors and/or circuit components as are known in the art and have been previously described herein. The signal trace 412 may comprise a first width 413 located in a signal trace anti-pad region 420 (similar to signal trace anti-pad region 120) which is wider than a second width 415 which is located in a ground plane region 422 (similar to ground plane region 122), thus reducing the impedance discontinuity between the component 418 and the signal trace 412, in the same manner as described previously herein. The ratio of the first width 413 of the signal trace 412 to the second width 415 of the signal trace 412 may range from about 2:1 to about 3:1, but depends on the particular application.

Figure 4B:
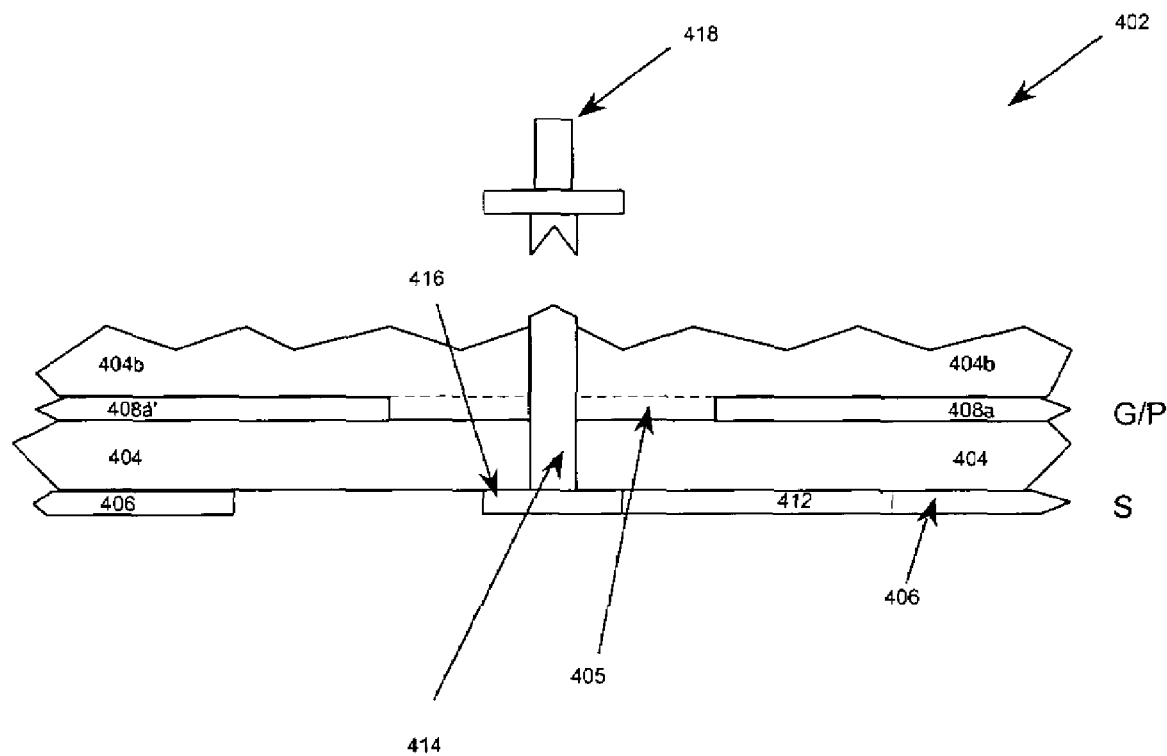
FIG. 4b represents a cross section of a test structure that may be formed when carrying out an embodiment of the present invention.

FIG. 4b depicts a cross-sectional view of the test structure 402 (which may comprise a microstrip configuration, which is well known in the art) of FIG. 4a. The signal trace 412 and the ground pad 406 are disposed on the dielectric layer 404, and may be on the bottom of a circuit board, (such as the circuit board 102). It will be understood by those skilled in the art that further layers may be built upon the test structure 402, such as a ground plane layer 408a, 408a', and dielectric layer 404b. An anti-pad region 405 similar to the anti-pad region 105) is disposed above the signal trace 412. The signal trace 412 further includes a via pad 416, which is electrically connected to a component 418 through a via 414.

Figure 5:
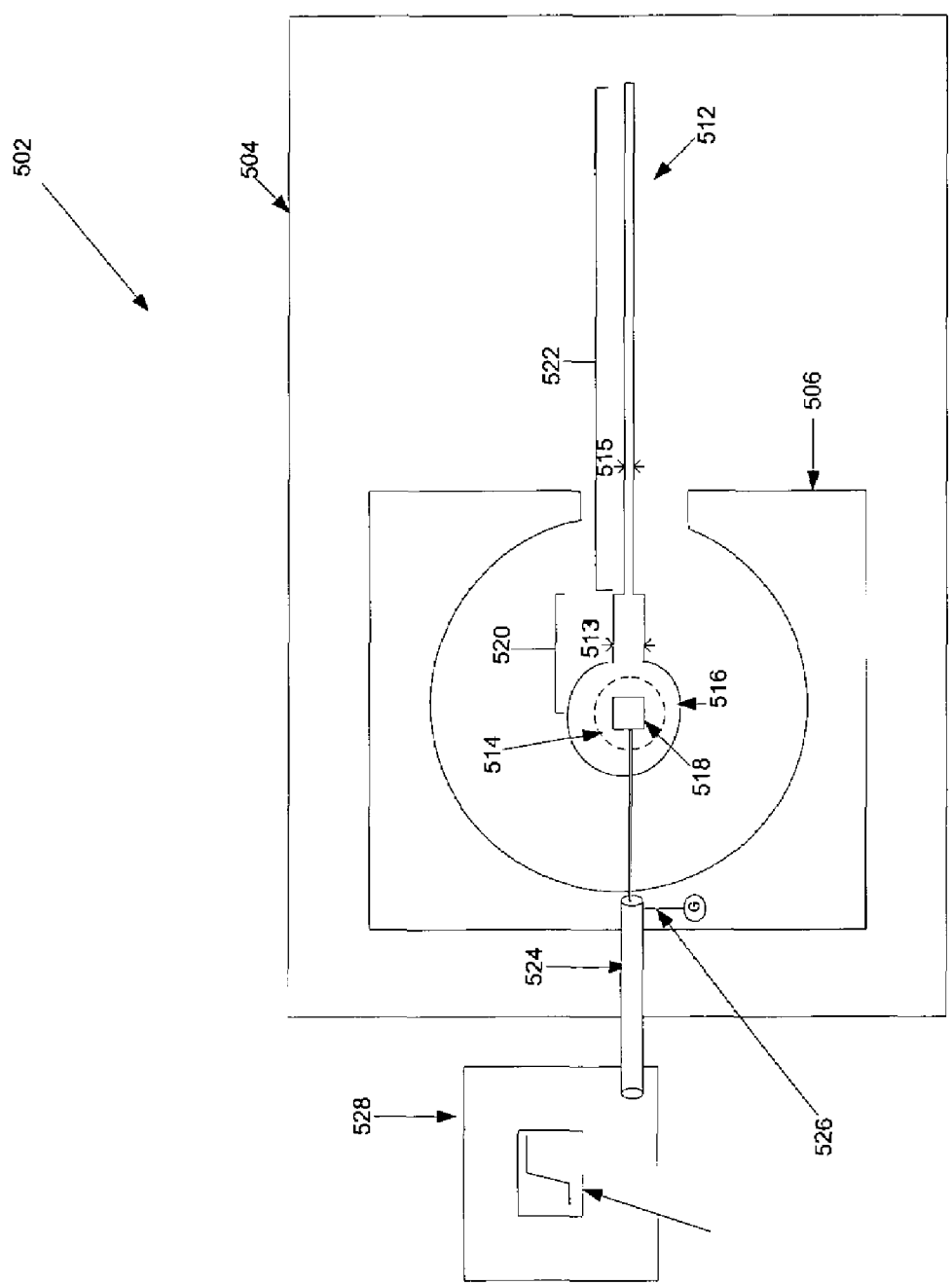
FIG. 5 is a top plan view of a test system in accordance with an embodiment of the present invention.

FIG. 5 is a top plan view of a test system 502 in accordance with another embodiment of the present invention. The test system 502 includes a prober 528, such as a TDR probing system that measures impedance, as is known in the art. The system 502 may also include a signal output 524 that is electrically connected to a component 518, and a signal ground 526 that is electrically connected to a ground pad 506 that is disposed on a dielectric layer 504. The test system 502 further includes a via 514 that may electrically connect to the component 518. A signal trace 512 is disposed on the dielectric layer 504, wherein the signal trace 512 may further comprise a via pad 516 that is electrically connected to the component 518 through the via 514 and the via pad 516. The signal trace 512 comprises a first width 513 and a second width 515. The first width 513 (located in a signal trace anti-pad region 520) of the signal trace 512 is wider than the second width 515 (located in a ground plane region 522).

The prober 528 can launch a signal 530 into the component 518. The signal 530 may be above 5 GHz, as is used in high frequency testing applications. The signal 530 will propagate into the test system 502 with a minimum of impedance discontinuity between the component 518 and the signal trace 512, such that a reflected signal from the signal trace 512 will truly reveal the ability of a circuit board, such as the multi-layer circuit board 102 (see FIG. 1a), to properly handle high frequency signals.

Applications which may include the multi-layer circuit board 102 (FIG. 1a), test structure 402 (FIG. 4) and test system 502 (FIG. 5) of the present invention include electronic circuitry used in high-speed computers, arrays of memory modules and other circuit cards, device drivers, power modules, communication circuitry, modems, processor modules, memory integrated circuits, embedded processors, and application-specific modules, including multi-layer, multi-chip modules. Such circuitry may further be included as sub-components within a variety of electronic systems, such as televisions, cellular telephones, personal computers, aircraft, and others.

FIGS. 1–5 are similarly useful in presenting the application of various methods which may be carried out according to the teachings of the present invention. Those of ordinary skill in the art will realize that various elements of the circuit boards and systems of the present invention may be assembled and used in accordance with the structures described in the various figures. However, for clarity, at least one embodiment of a method conducted according to the teachings of the present invention will be specifically illustrated.

Figure 6:
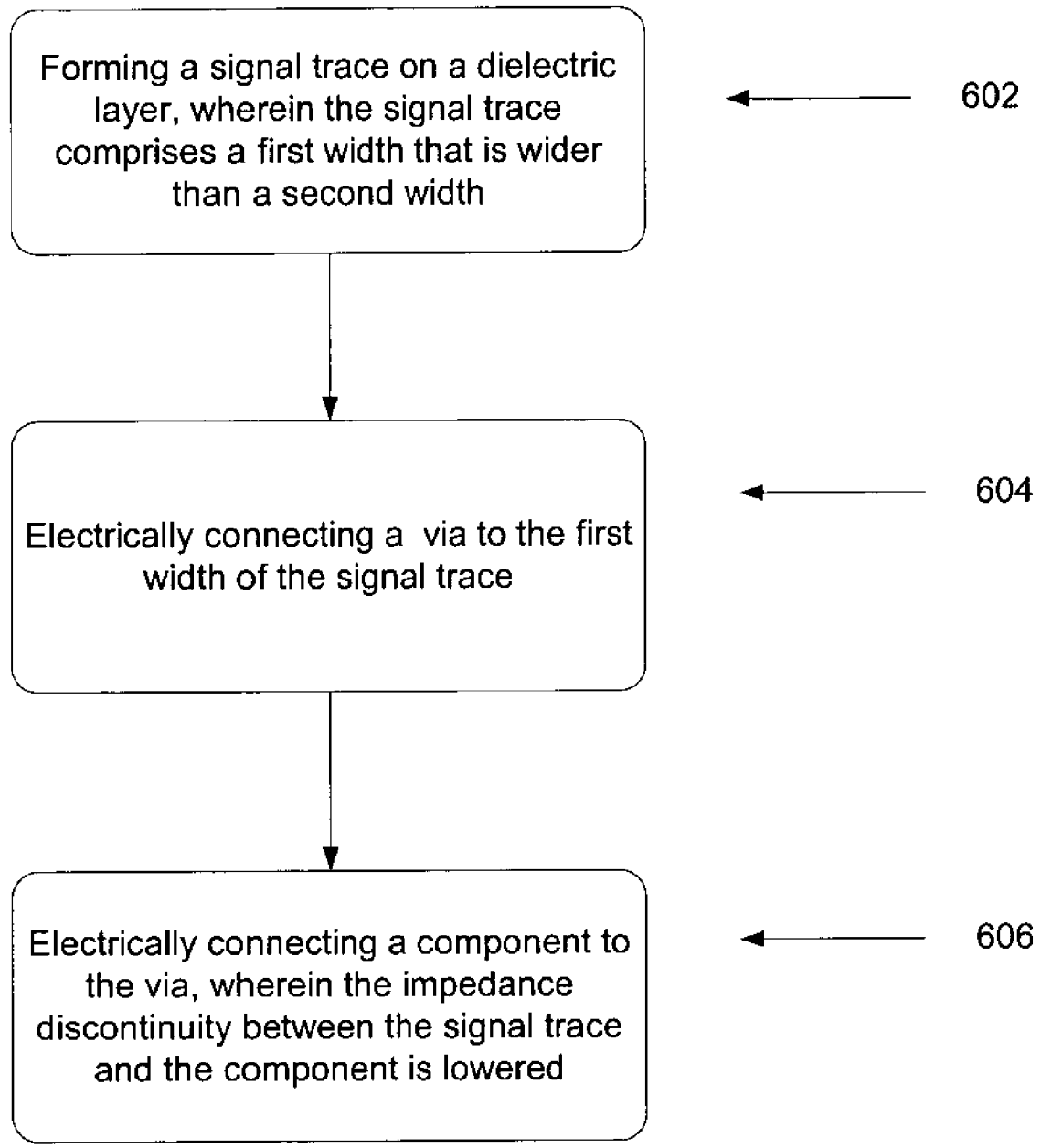
FIG. 6 is a process flow diagram of a method in accordance with an embodiment of the present invention.

FIG. 6 is a process flow diagram of a method in accordance with an embodiment of the present invention. The method may be used to minimize impedance discontinuities between a signal trace and a component that would otherwise not be possible in multi-layer circuit boards without using the method of the present invention. The method includes forming a signal trace on a dielectric layer, wherein the signal trace comprises a first width that is wider than a second width 602, electrically connecting a via to the first width of the signal trace 604, and electrically connecting a component to the via, wherein the impedance discontinuity between the signal trace and the component is lowered 606.

The method may also be used to tailor the size of high-speed, high-frequency signal traces while maintaining low characteristic impedance of the signal traces and allowing more low impedance signal traces to be included in the multi-layer circuit board because of the tailored size. It will be appreciated by those skilled in the art that various optimization techniques, such as full wave modeling, may be applied to further optimize the physical dimensions of the invention, including the dimensions of anti-pad region, the via, and the via pad for a particular application.

Thus, the present invention provides novel multi-layer circuit boards, test structures and test systems. According to the teachings of the invention, methods are also disclosed to form such multi-layer circuit boards, test structures and test systems. The invention greatly improves the accuracy of, and contributes uniformity to, TDR measurements, and other high frequency test and characterization measurements, since the ability to minimize impedance discontinuities while maintaining a desired impedance up to the measurement point with respect to testing signals is provided.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of multi-layer circuit boards, test structures and test systems are well known in the art. Therefore, it is appreciated that the Figures provided herein illustrate only portions of exemplary multi-layer circuit boards, test structures and test systems that pertain to the practice of the present invention. Thus the present invention is not limited to the structures described herein.

What is claimed is:
1. A multi-layer circuit board, comprising:
   at least one signal trace disposed on a dielectric layer, wherein the at least one signal trace comprises a first width that is wider than a second width, and wherein the first width of at least one signal trace is located in a signal trace anti-pad region, wherein the signal trace anti-pad region extends from the center of the via to slightly past the edge of an anti-pad region; and at least one via electrically connected to the first width of the at least one signal trace, wherein an impedance discontinuity between the at least one signal trace and a component electrically connected to the at least one via is lowered from above about 5 ohms to less than about 1 ohm.

2. The multi-layer circuit board of claim 1 wherein the ratio of the first width to the second width is between about 2:1 and 3:1.

3. The multi-layer circuit board of claim 1 wherein the second width of the at least one signal trace is located in a ground plane region, wherein the ground plane region extends from slightly past the edge of an anti-pad region to the end of the signal trace opposite the first width of the signal trace.

4. The multi-layer circuit board of claim 1 wherein the signal trace further comprises a via pad.

5. The multi-layer circuit board of claim 1 wherein the first width of the at least one signal trace is not substantially disposed over a ground plane.

6. A test structure, comprising:

at least one signal trace disposed on a dielectric layer, wherein the at least one signal trace comprises a first width that is wider than a second width, and wherein the first width of at least one signal trace is located in a signal trace anti-pad region, wherein the signal trace anti-pad region extends from the center of the via to slightly past the edge of an anti-pad region;

a via connected to the first width of the at least one signal trace; and a component electrically attached to the via, wherein an impedance discontinuity between the at least one signal trace and the component is lowered from above about 5 ohms to below about 1 ohm.

7. The test structure of claim 6 wherein the ratio of the first width to the second width is between about 2:1 and 3:1.

8. The test structure of claim 6, wherein the second width is located in a ground plane region.

9. The test structure of claim 6 wherein the at least one signal trace is not substantially disposed over an underlying ground plane in the signal trace anti-pad region.

10. The test structure of claim 6 wherein the component is one of a SMA, BNC or SIP connector.

11. The test structure of claim 6 wherein the component is one of a socket, a microprocessor, or a circuit component.

12. The test structure of claim 6 wherein the component is adapted for receiving a signal.

13. The test structure of claim 12, wherein the signal is launched through a prober and a signal output is coupled to the component.

14. The test structure of claim 12, wherein the signal has a frequency of above about 5 Gigahertz.

15. A test system, comprising:

a TDR prober including a signal output and a signal ground;

at least one ground pad disposed on a dielectric layer, wherein the ground pad is coupled to the signal ground;

at least one signal trace disposed on the dielectric layer, wherein the at least one signal trace comprises a first width that is wider than a second width, and wherein the first width of at least one signal trace is located in a signal trace anti-pad region, wherein the signal trace anti-pad region extends from the center of the via to slightly past the edge of an anti-pad region; and a component electrically connected to the first width of the at least one signal trace, wherein the component is coupled to the signal output, and wherein an impedance discontinuity between the at least one signal trace and the component is lowered from above about 5 ohms to less than about 1 ohm.

16. The test system of claim 15 wherein the ratio of the first width to the second width is between about 2:1 and 3:1.

17. The test system of claim 15 wherein the component is a SMA connector.

18. The test system of claim 15 wherein the TDR prober comprises a TDR probing system.

19. A method of forming a test structure, comprising:

forming a signal trace on a dielectric layer, wherein the signal trace comprises a first width that is wider than a second width, and wherein the first width of at least one signal trace is located in a signal trace anti-pad region, wherein the signal trace anti-pad region extends from the center of the via to slightly past the edge of an anti-pad region;

electrically connecting a via to the first width of the signal trace; and electrically connecting a component to the via, wherein the impedance continuity between the signal trace and the component is lowered from above about 5 ohms to below about 1 ohm.

20. The method of claim 19 wherein forming the signal trace comprises forming the first width of the signal trace to be wider than the second width by a ratio of between about 2:1 to about 3:1.

* * * * *